United States Patent
Land et al.

(10) Patent No.: US 10,992,137 B2
(45) Date of Patent: Apr. 27, 2021

(54) MITIGATION OF ALTERNATING CURRENT IN PIPELINES

(71) Applicant: DNV GL USA, Inc., Katy, TX (US)

(72) Inventors: Jason Land, Dublin, OH (US); Shane Finneran, Hilliard, OH (US); Thomas Yahner, Parma Heights, OH (US)

(73) Assignee: DNV GL USA, Inc., Kay, TX (US)

(*) Notice: Subject to any disclaimer, the term of this patent is extended or adjusted under 35 U.S.C. 154(b) by 161 days.

(21) Appl. No.: 16/383,344

(22) Filed: Apr. 12, 2019

(65) Prior Publication Data

US 2020/0328596 A1  Oct. 15, 2020

(51) Int. Cl.
| | |
|---|---|
| F17D 1/08 | (2006.01) |
| H02J 3/36 | (2006.01) |
| H03H 7/06 | (2006.01) |
| F17D 5/08 | (2006.01) |

(52) U.S. Cl.
CPC .............. *H02J 3/36* (2013.01); *F17D 5/08* (2013.01); *H03H 7/06* (2013.01); *H02J 2003/365* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,132,593 A * | 10/2000 | Tan | ........................ | G01N 17/02 204/404 |
| 2004/0112737 A1* | 6/2004 | Benham | .................. | C23F 13/04 204/196.11 |
| 2006/0070871 A1* | 4/2006 | Bushman | ................ | C23F 13/02 204/196.01 |
| 2010/0101933 A1* | 4/2010 | Stefanini | ................ | C23F 13/06 204/157.15 |
| 2010/0292859 A1* | 11/2010 | Terasaki | .................. | H02M 5/06 700/295 |
| 2011/0024183 A1* | 2/2011 | Clairmont | ................ | H02G 7/20 174/40 R |
| 2011/0238347 A1* | 9/2011 | Gemperli | ................ | C23F 13/04 702/65 |
| 2012/0205256 A1* | 8/2012 | Catte | ....................... | C23F 13/04 205/724 |
| 2012/0305386 A1* | 12/2012 | Schutt | ..................... | C23F 13/16 204/196.38 |
| 2013/0214771 A1* | 8/2013 | Tiernan | ................ | G01N 27/904 324/242 |
| 2014/0069542 A1* | 3/2014 | Graham | .................. | F16L 55/07 138/104 |
| 2016/0308290 A1* | 10/2016 | Moghbeli | ............... | F16L 57/00 |

(Continued)

*Primary Examiner* — Adam D Houston
(74) *Attorney, Agent, or Firm* — Eversheds Sutherland (US) LLP

(57) ABSTRACT

This disclosure describes systems, methods, and devices related to alternating current (AC) mitigation. An AC mitigation system may comprise a conductive portion of the pipeline, wherein the conductive portion of the pipeline is adjacent to a high voltage AC power transmission line. The AC mitigation system may comprise a ground wire connected to the conductive portion of the pipeline. The AC mitigation system may comprise a circuit electrically connected to the ground wire. The AC mitigation system may comprise a means for the conductive portion of the pipeline to route AC power through the circuit.

18 Claims, 10 Drawing Sheets

(56) References Cited

U.S. PATENT DOCUMENTS

| | | | | |
|---|---|---|---|---|
| 2017/0220057 | A1* | 8/2017 | Jachim | G05F 1/12 |
| 2017/0356587 | A1* | 12/2017 | Burbridge | F16L 9/02 |
| 2019/0033052 | A1* | 1/2019 | Amineh | G01B 21/08 |
| 2019/0143383 | A1* | 5/2019 | Al-Mahrous | B08B 9/0557 |
| | | | | 15/104.062 |
| 2019/0229535 | A1* | 7/2019 | Pmsvvsv | H01M 8/04992 |
| 2019/0293547 | A1* | 9/2019 | Daneshmand | G01N 17/04 |
| 2020/0116445 | A1* | 4/2020 | Walsh | F28G 13/00 |
| 2020/0216966 | A1* | 7/2020 | Hashemi | C23F 13/20 |
| 2020/0232102 | A1* | 7/2020 | Pinney | C23F 13/04 |
| 2020/0312471 | A1* | 10/2020 | Ishida | C22C 38/04 |
| 2020/0320109 | A1* | 10/2020 | Zamanzadeh | G06F 16/2458 |
| 2020/0328596 | A1* | 10/2020 | Land | F17D 5/08 |

\* cited by examiner

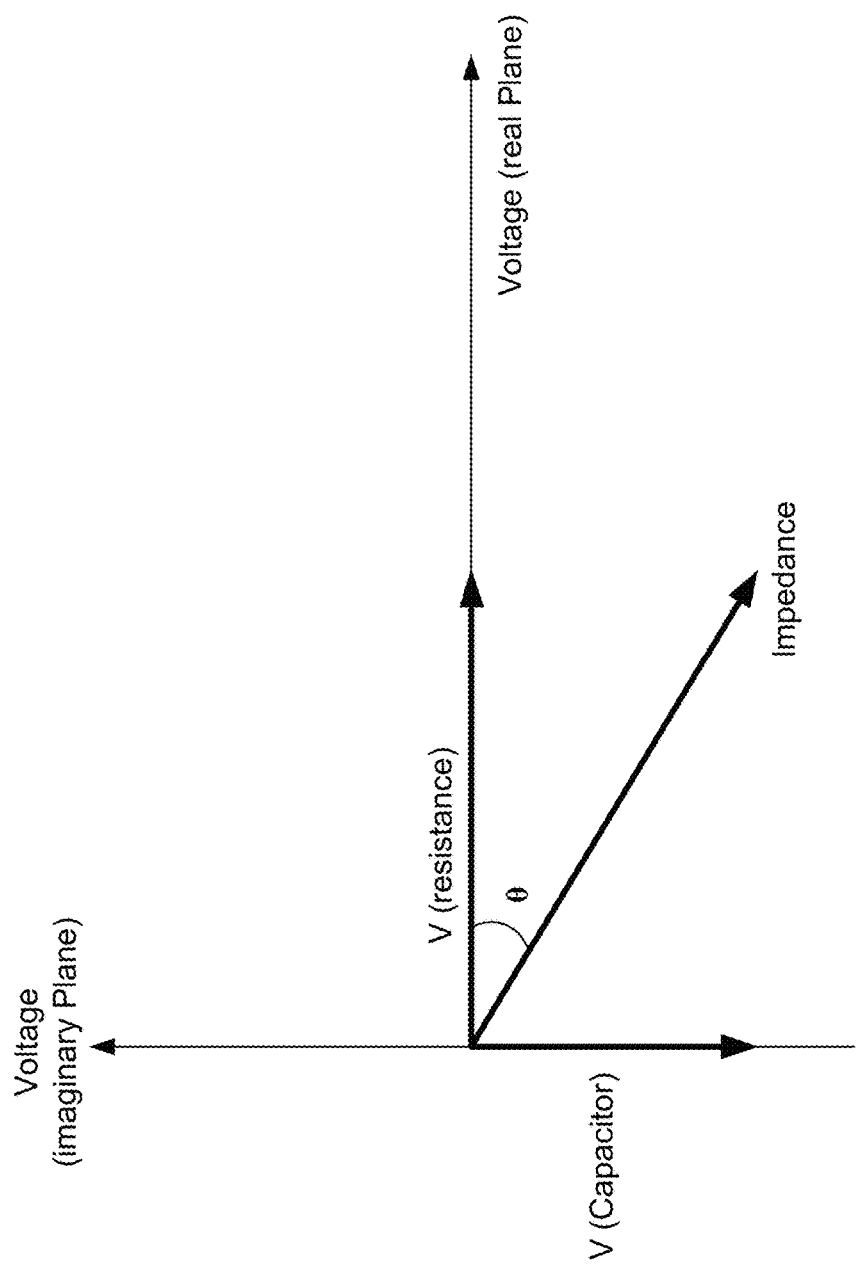

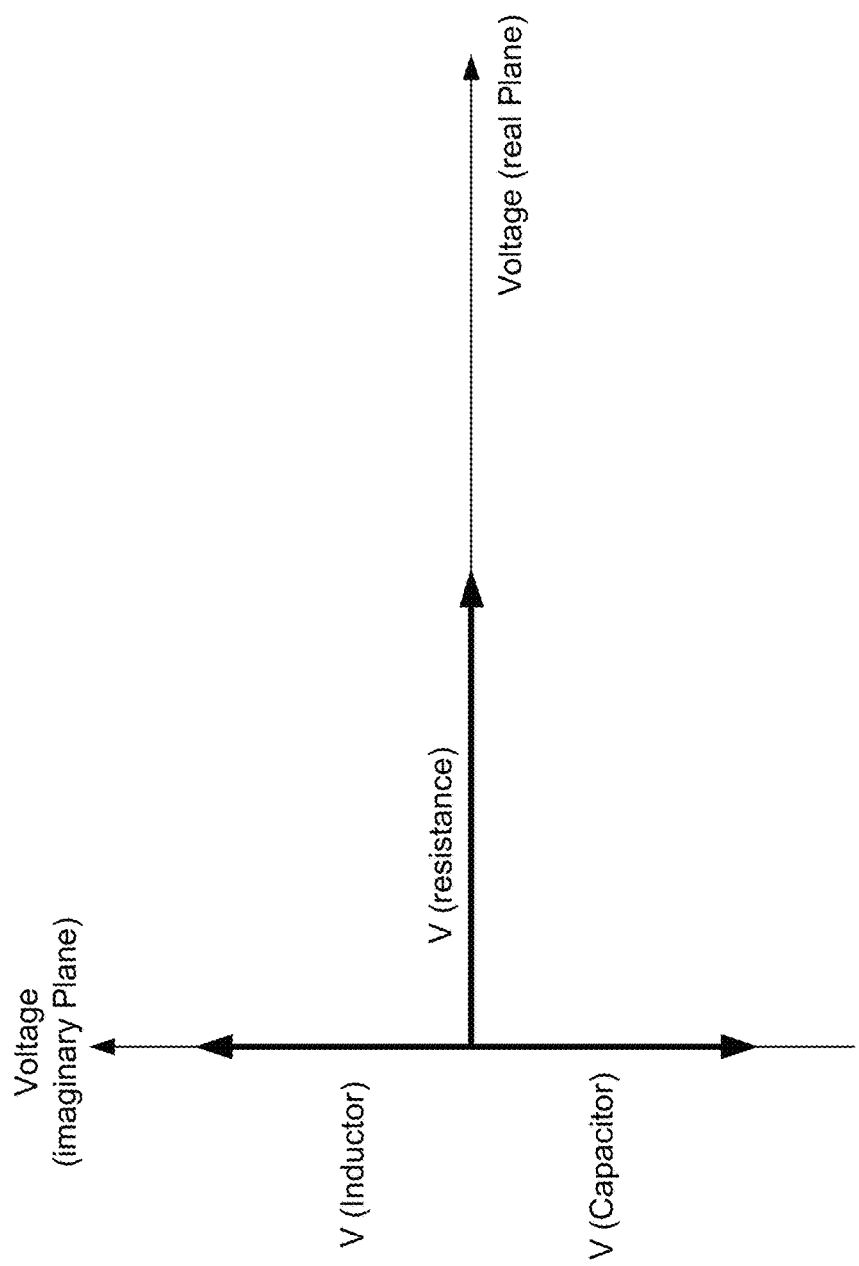

MITIGATION OF ALTERNATING CURRENT IN PIPELINES

TECHNICAL FIELD

This disclosure generally relates to systems and methods for alternating current (AC) and, more particularly, to mitigation of AC in pipelines.

BACKGROUND

Pipelines are commonly found adjacent to high-voltage alternating current (HVAC) transmission lines in order to maximize the use of right of way. However, these pipelines are subjected to undesired effects from the collocated HVAC transmission lines. The HVAC transmission lines may result in interference with the pipeline, which can contribute to corrosion in the pipeline, and safety and health hazards to: operators, maintenance workers, and the general public. The subject of HVAC transmission lines interference has been a growing concern across multiple industries in recent decades due to congestion of right of way resulting in an increase in incidents in pipelines.

BRIEF DESCRIPTION OF THE DRAWINGS

FIGS. 2A-2C illustrate schematic diagrams for a circuit and associated observations, in accordance with one or more example embodiments of the present disclosure.

DETAILED DESCRIPTION

Figure 1:
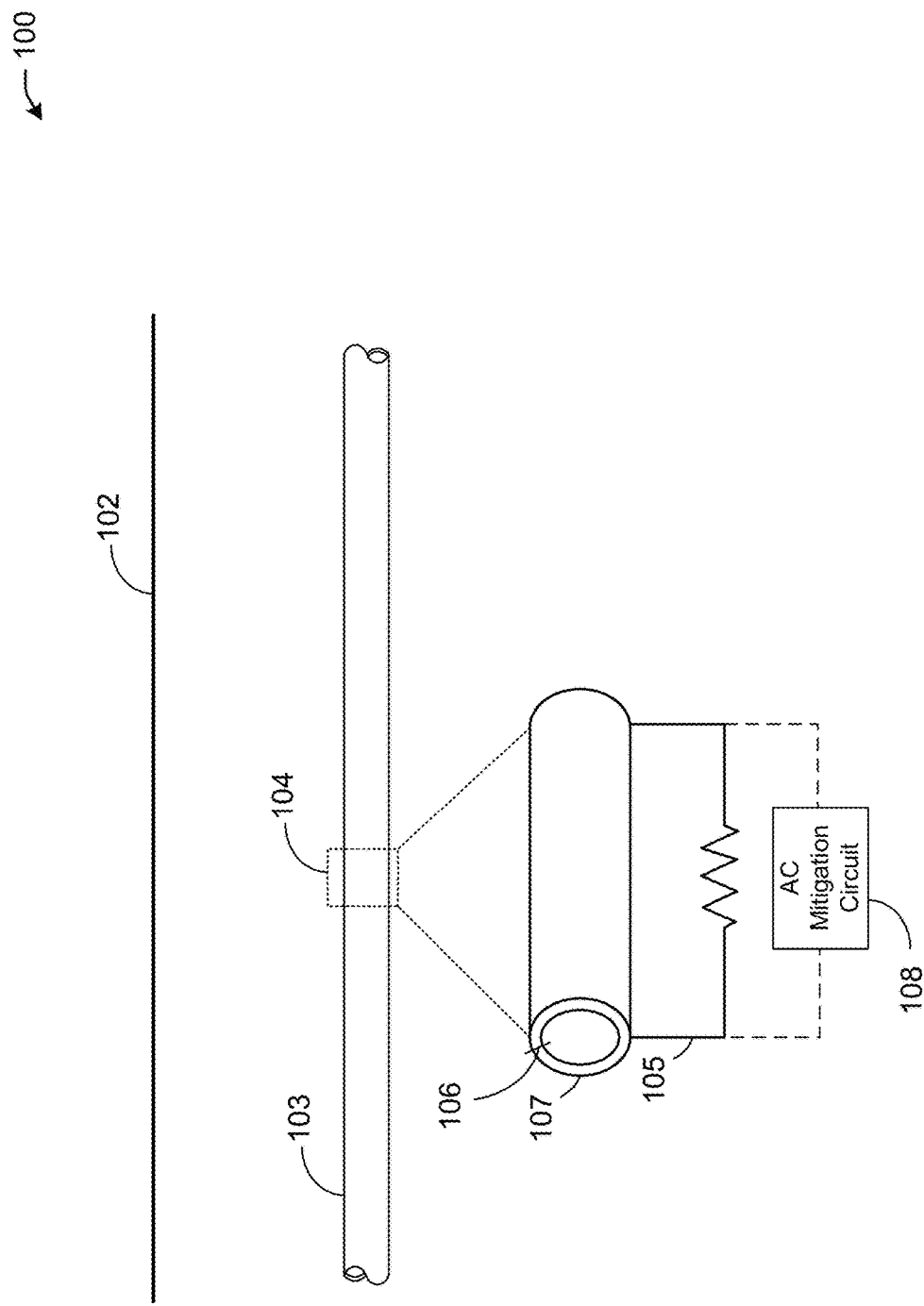
FIG. 1 illustrates a network diagram illustrating an example network environment for alternating current (AC) mitigation, in accordance with one or more example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

When a pipeline runs adjacent in a parallel fashion to high-voltage power lines, the AC current in the power lines induces AC current in the pipeline. The material used for coating of a pipeline may play a role in providing a means for the induced AC current to buildup. The coating acts as a dielectric of a capacitor that stores that induced AC current buildup. This may result in a dangerous environment around the pipeline and increases the risk of external metal loss of the pipeline due to AC induced corrosion.

High-voltage interference is an ongoing problem in the pipeline industry for some time now. Pipelines located near high voltage alternating current (HVAC) transmission lines may be subjected to induced AC current buildup. Induced AC current exists in situations where the pipelines are located near HVAC transmission lines where an AC potential or current density is induced on the pipeline. Some of the problems that may result of this high-voltage interference may include safety, corrosion, leakage, and other side effects due to induced AC current buildup. Present mitigation strategies employ techniques centered around grounding such that parallel electrical paths are added in order to dump excess electrical charge (AC current) safely to ground. In some situations this may be sufficient but the majority of pipeline applications will need substantial amount of grounding in order to provide protection from the excess electrical charge. For example, a long stretch of pipeline that is collocated with HVAC transmission lines would result in a significantly high electromagnetic field build-up and hence an increased induced AC current buildup, which would require a long stretch of grounding solutions. This may proportionally increase the cost and complexity of using the various ground solutions. Further, grounding alone may not be enough to get a low enough impedance to pass the AC current buildup to the ground. There is a need to solve or mitigate potential that is induced on a pipeline that uses techniques involving active electronics as opposed to the costly and insufficient passive grounding solutions.

Example embodiments of the present disclosure relate to systems, methods, and devices for using one or more circuits for mitigating AC in pipelines.

In one embodiment, an AC mitigation system may facilitate a parallel connection of an active circuit to the pipeline. The circuit may comprise one or more transformers such that one side of a transformer circuit (e.g., primary circuit) may be connected to a grounding line that is electrically connected to the pipeline. The other side of the transformer circuit (e.g., secondary circuit) may be connected to a load in order to remove energy flowing into the transformer. The transformer may be a step-up or a step-down transformer having a ratio. The number of windings and the ratio of the transformer may be selected based on measurements performed at a section of the pipeline.

In one or more embodiments, an AC mitigation system may facilitate the addition of one or more capacitors to the circuit. The addition of the one or more capacitors may result in lowering the impedance of the circuit. Having a lower impedance increases the AC current flow in the circuit. It should be understood that capacitors may be already included in AC mitigation systems in order to minimize the interaction of the AC mitigation circuit with the already present cathodic protection system on the pipeline used to control external metal loss due to DC corrosion. In one or more embodiments, an AC mitigation system may minimize impedance and may draw energy out of the system either through heat or other ways in order to remove energy without bringing it back to the source (e.g., the pipeline).

In one or more embodiments, an AC mitigation system may minimize impedance and may draw energy out of the system either through heat or other ways in order to remove energy without bringing it back to the source (e.g., the pipeline).

In one more embodiments, an AC mitigation system may facilitate the introduction of one or more transformers to the grounding path to create a resonant condition, referred to as a RLC circuit consisting of a resistor (R), inductor (L), and capacitor (C), from the known frequency of the induced AC resulting in the removal of energy from the circuit in the form of a magnetic field or electric field. When an RLC circuit is tuned to its resonant condition the power angle is zero, thus removing unnecessary impedance due to capacitance only, which is the case for current AC mitigation designs. The transformer may in turn facilitate the transfer energy to its secondary circuit effectively helping drain energy which reduces the induced voltage on the AC mitigated pipeline and the total energy returning to ground.

In one or more embodiments, an AC mitigation system may be tuned at install in order to achieve a desired level of AC current mitigation on a pipeline. In other embodiments, the AC mitigation system may be varied one time after the install in order to achieve a desired level of AC current mitigation on the pipeline.

In one or more embodiments, an AC mitigation system may facilitate using a continuous measurement of the AC potential on a pipeline and may utilize a computer system comprising one or more processors and related hardware to allow the selection of various capacitances of capacitors in the circuit and allow the selection of various windings of a transformer in order to achieve a desired level of AC current mitigation on a pipeline.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 is a network diagram illustrating an example network environment 100 of for AC mitigation, according to some example embodiments of the present disclosure.

As explained above, pipelines located near high voltage alternating current (HVAC) transmission power lines may be subjected to induced AC current buildup. AC current buildup may present as high AC voltage on a pipeline, possibly creating environments that present a safety concern due to hazardous touch potential or step potential. Similarly, when high AC current density is present on a pipeline, it creates an environment where the pipeline is susceptible to possible external metal loss due to corrosion.

Referring to FIG. 1 there is shown, a power line 102 adjacent to a pipeline 103. The example shown in this figure shows that the power line 102 is parallel to the pipeline 103. The pipeline 103 may be electrically connected to a ground wire 105. A section 104 of the pipeline 103 is shown in more detail showing a thickness 106 of the pipeline 103 and an external coating 107.

In one or more embodiments, an AC mitigation circuit 108 may be attached to the section 104 of the pipeline 103 in order to facilitate an embedded AC mitigation approach that reduces or eliminates induced AC currents on at least a section of the pipeline 103 (e.g., section 104).

Present mitigation strategies employ parallel electrical paths effectively releasing some of the excess electrical charge safely to ground. These strategies may use capacitors to stop direct current (DC) flow down these parallel paths which maintains the effectiveness integrity of cathodic protection (CP) systems installed on the pipeline and allows at least some of the induced AC currents to freely take the parallel path to ground. Three forms of AC grounding systems are generally used in industry: ground mat, deep ground beds, and horizontal ground ribbons.

The ground mat is primarily used in a local environment to help mitigate against hazardous AC touch and/or step potentials. Conversely, deep ground beds and horizontal ground ribbons are used in an attempt to control the amount of AC current found on a pipeline by allowing some of the AC current to discharge from the pipeline without contributing to the external metal loss due to corrosion. A deep ground bed connects the pipeline to a grounding system that runs perpendicular to the pipeline deep into the ground, generally around 200 feet or more. This grounding system is a higher capacity mitigation system that is typically more complex and expensive to install. Ground ribbon (e.g., ground wire 105) is generally installed parallel to the pipeline (e.g., pipeline 103) in the same right of way (ROW), requiring space next to the pipeline to install the ground ribbon along the sections of concern. In certain cases, numerous deep ground beds, and/or multiple horizontal ribbons in parallel can require significant ROW access which may not exist. Additional horizontal ribbon parallel circuits result in diminishing returns when judged against its effectiveness to mitigate induced stray AC current.

Typical AC mitigation techniques all utilize low impedance grounding to transmit induced AC current to ground, which are typically bare ground wires. While utilizing the grounding technique for AC mitigation may be effective for many AC interference scenarios, industry cases have been identified where collocations could not be adequately mitigated below recommended limits for AC potential or current density. This may be due to elevated transmission currents, unfavorable soil resistivity conditions, or physical restrictions limiting the level of grounding that can practically be installed. For these cases, there is a need for additional mitigation techniques to identify options to further reduce induced AC where necessary.

In one or more embodiments, experimentation may be performed in an attempt to assess alternative methods (e.g., using the AC mitigation circuit 108) to increase the mitigation capacity of a parallel ground ribbon (e.g., ground wire 105). In one or more embodiments, the experimentation may be performed to determine the amount of induced AC current on section 104 of the pipeline 103. The AC mitigation circuit 108 may be used to mitigate this induced AC current in order to reduce or eliminate negative side effects such as interference, corrosion, and safety hazards. Typically, reducing AC voltage on pipelines relies on using parallel ground paths as a mitigation technique. However, this has shortcomings such that it may not largely reduce or eliminate the negative side effects. For example, pipeline wall loss due to corrosion could lead to possible leaks or possible ruptures in the pipeline 103 leading to unintended release in the pipeline 103. With HVAC transmission systems next to pipeline 103, a power line's (e.g., power line 102) electromagnetic field may influence pipeline 103, acting like a big antenna, by inducing AC current onto the pipeline 103. Once the AC current is picked up by the pipeline 103, the AC current wants to return to its source and it does that by hopping from the pipeline 103 to the ground. This problem increases with the introduction of coating 107 that exists on the pipeline. The coating 107 is an electrical resistance dielectric. The pipeline 103 being metallic and the introduction of the dielectric of coating 107 in addition to the ground, which is a highly conductive material, results in two conductive material separated by dielectric. As a result, the coating 107 will act as a capacitor. Therefore, electrons will have a way to pass through the dielectric material (e.g., coating 107) to the ground. Consequently, as electrons move from the pipeline 103 to the ground corrosion occur in the pipeline.

In one or more embodiments, an AC mitigation circuit may facilitate utilizing an active circuit as opposed to a passive circuit (e.g., only a ground wire connected to ground). In one or more embodiments, the AC mitigation circuit 108 may comprise one or more transformers and/or one or more capacitors that may be electrically connected the section 104 of the pipeline 103 in various configurations. For example, the one or more transformers may be electrically connected to the section 104 in parallel or in series with the ground wire 105. Further, one or more capacitors may be added in parallel or in series with the ground wire 105. Although one or more capacitors are discussed here, some embodiments may not require these one or more capacitors. For example, in some embodiments, only transformers placed in parallel or in series with the ground wire 105 may be sufficient to mitigate the AC current buildup on the section 104 of the pipeline 103. It is understood that the above descriptions are for purposes of illustration and are not meant to be limiting.

Figure 2A:
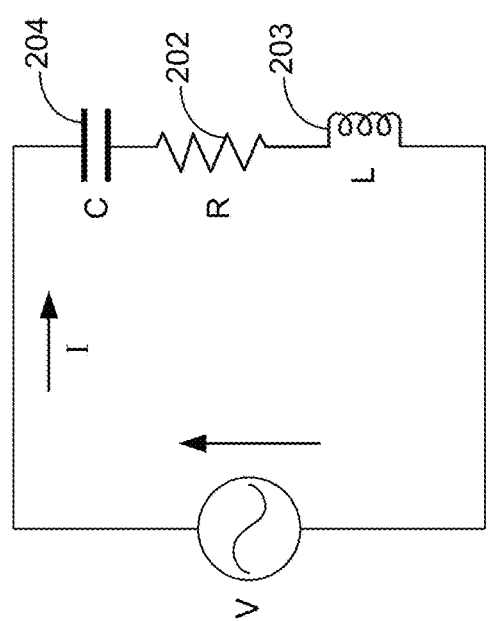

FIGS. 2A-2C illustrate schematic diagrams for a circuit and associated observations, in accordance with one or more example embodiments of the present disclosure Referring to FIG. 2A, there is shown the RLC circuit 200 consisting of a resistor (R) 202, inductor (L) 203, and capacitor (C) 204 connected either in series or in parallel. The RLC circuit 200 may operate as a harmonic oscillator for current that when properly tuned, will remove energy from the circuit in the form of an electric field or a magnetic field. Knowing the frequency (f) of the AC current measured directly from the pipeline (e.g., pipeline 103 of FIG. 1), a matched pair of inductance and capacitance to introduce a resonant frequency can be determined. Having measured the frequency induced on the pipeline (f), a capacitance, and inductance are selected to satisfy the resonant condition, given in Equation 1 as derived from the Kirchhoff loop containing a capacitor and an inductor set at the resonant condition.

$$f = \frac{1}{2\pi\sqrt{LC}}$$ Equation 1

An added benefit to the resonant condition is the lowering of the impedance in the Kirchhoff loop. This allows only the real resistance in the circuit to dictate how many parallel paths can be used to mitigate large current densities associated with AC current induced on pipelines.

FIG. 2B shows the typical design condition where ground ribbon is connected to the pipeline through a capacitor. FIG. 2B is a complex voltage plane representation of AC mitigation using only a capacitor. As shown, using a capacitor would result in a power angle, θ, not equal to zero because the RLC circuit 200 is not tuned to its resonant condition. Typically, a resonant condition is achieved by balancing the selection of the capacitor 204 with the selection of the inductor 203. When a RLC circuit is tuned to its resonant condition, the power angle θ is reduced to zero thus removing unnecessary impedance due only to capacitance, which is the case for most current AC mitigation designs.

FIG. 2C shows the effect of resonance with the additional inductance added and the RLC circuit 200 that is tuned to resonance. FIG. 2C shows a complex voltage plane representation of AC mitigation using a capacitor in series with an inductor where the RLC circuit is operating at resonance. Adding the phasors represents the total impedance of the system, with a power angle, θ, equal to zero. The impedance is minimized and equal to the resistance of the circuit.

Additionally, a transformer can be designed to transfer energy from the AC mitigation system (primary circuit) to the transformer's secondary circuit, effectively draining energy from the AC mitigation system. This may further reduce the AC current induced on a pipeline.

It is understood that the above descriptions are for purposes of illustration and are not meant to be limiting.

Figure 3A:
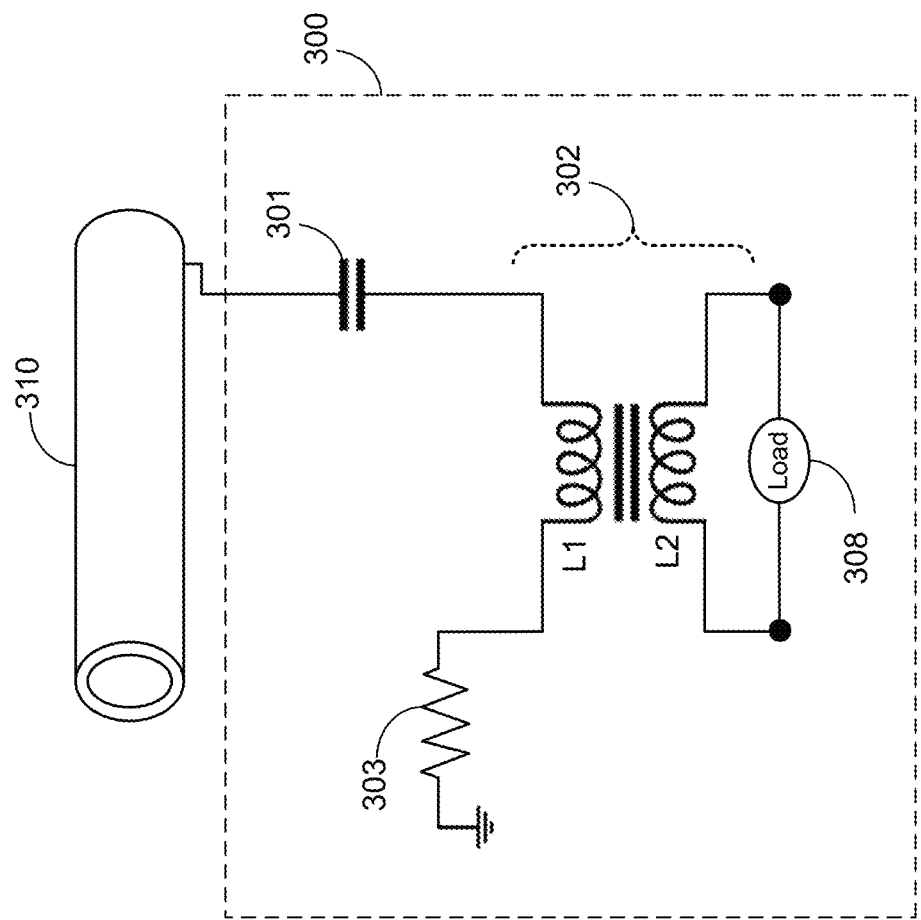
FIGS. 3A-3C illustrate schematic diagrams for AC mitigation circuits, in accordance with one or more example embodiments of the present disclosure.

FIG. 3A depicts an illustrative schematic diagram for an AC mitigation circuit 300, in accordance with one or more example embodiments of the present disclosure.

Referring to FIG. 3A, the AC mitigation circuit 300 may be connected to a section 310 of a pipeline (e.g., pipeline 103 of FIG. 1) in order to mitigate AC current build up on the section 310.

The AC mitigation circuit 300 may be comprised of a capacitor 301, a transformer 302, and a ground wire 303. The transformer 302 may be comprised of two inductor windings, L1 and L2. The ground wire 303 may be a zinc ribbon which acts as a resistor and which is directly connected to ground.

In one or more embodiments, the AC mitigation circuit 300 may facilitate a simple harmonic oscillator which will decrease the amount of energy in the circuit by about 50%. This may be achieved by balancing and selecting specific capacitor 301 and a specific L1 of the transformer 302 in order to achieve a resonant condition. Then L2 may be selected in comparison to L1 in order to decide on a type of transformer, e.g., a step-up or a step-down transformer. The L2 may be connected to a load 308 in order to remove energy from the circuit resulting in mitigation of the AC current buildup on the pipeline. In order to get into a resonant condition, the number windings on the transformer 302 may have to correlate to the capacitance in the capacitor 301. In other words, the capacitor 301 may be chosen that has a specific capacitance, such that a transformer 302 may be chosen to have a number of windings that match the capacitance of the capacitor 301.

In one or more embodiments, the AC mitigation circuit 300 may be tuned at install in order to achieve a desired level of AC current mitigation on the pipeline section 310. In other embodiments, the AC mitigation circuit 300 may be varied one time after the install in order to achieve a desired level of AC current mitigation on the pipeline section 310.

In one or more embodiments, the AC mitigation circuit 300 may facilitate using a continuous measurement of the AC potential on the pipeline section 310 and may utilize a computer system (e.g., machine 600 of FIG. 6) comprising one or more processors and related hardware to allow the selection of various capacitances of capacitors in the circuit and allow the selection of various windings of a transformer in order to achieve a desired level of AC current mitigation on the pipeline section 310.

It should be understood that the above configuration of the AC mitigation circuit 300 could be modified in order to adjust the level of mitigation of the AC current buildup on the pipeline. For example, in some scenarios the AC mitigation circuit 300 may not necessarily comprise the capacitor 301, instead, the pipeline section 310 may be directly connected to the transformer 302 and the ground wire 303. It is understood that the above descriptions are for purposes of illustration and are not meant to be limiting.

Figure 3B:
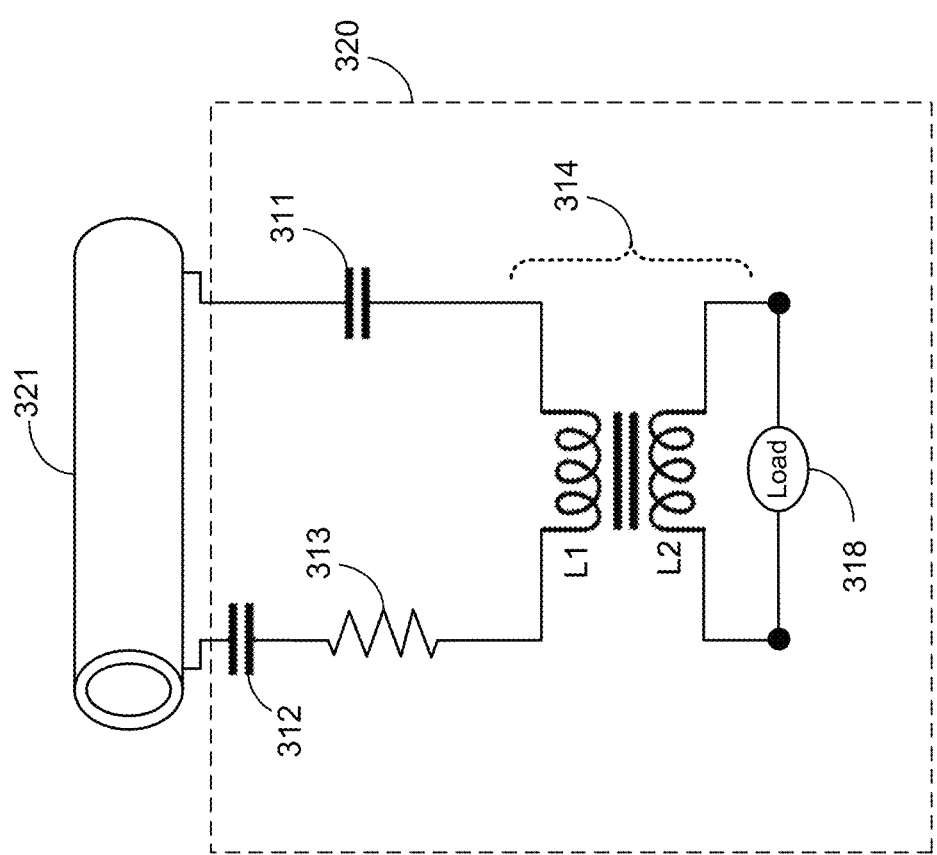

FIG. 3B depicts an illustrative schematic diagram for an AC mitigation circuit 320, in accordance with one or more example embodiments of the present disclosure.

Referring to FIG. 3B, the AC mitigation circuit 320 may be connected to a section 321 of a pipeline (e.g., pipeline 103 of FIG. 1) in order to mitigate AC current buildup on the section 321.

In one or more embodiments, the AC mitigation circuit 320 may be comprised of a first capacitor 311, a second capacitor 312, a ground wire 313 (acting as a resistor), and a transformer 314. The second capacitor 312 may be optional and may be used in order not to impede the cathodic protection. The second capacitor 312 acts as a filter and does not allow the DC cathodic protection to leave the section 321 of the pipeline. Cathodic protection is a means of mitigating and controlling external metal loss due to DC corrosion where a particular DC potential is maintained on the section of the pipeline are which makes the section of the pipeline a cathode and which reduces the potential difference with the surrounding soil (electrolyte). The AC mitigation circuit 320 is still considered an RLC circuit because selecting and balancing the capacitor 311, the capacitor 312, and a specific inductor L1 of the transformer 314 results in a resonant condition.

In one or more embodiments, the AC mitigation circuit 320 may facilitate a decrease in the amount of energy in the circuit. This may be achieved by balancing and selecting specific capacitor 311 and a specific inductor L1 of the transformer 314 in order to achieve a resonant condition. Then L2 may be selected in comparison to L1 in order to decide on a type of transformer, e.g., a step-up or a step-down transformer. The L2 may be connected to a load 318 in order to remove energy from the circuit resulting in mitigation of the AC current buildup on the pipeline. In order to get into a resonant condition, the number windings on the transformer 314 may have to correlate to the capacitance in the capacitor 311. In other words, the capacitor 311 may be chosen that has a specific capacitance, such that a transformer 314 may be chosen to have a number of windings that match the capacitance of the capacitor 311.

In one or more embodiments, the AC mitigation circuit 320 may be tuned at install in order to achieve a desired level of AC current mitigation on the pipeline section 321. In other embodiments, the AC mitigation circuit 320 may be varied one time after the install in order to achieve a desired level of AC current mitigation on the pipeline section 321.

In one or more embodiments, the AC mitigation circuit 320 may facilitate using a continuous measurement of the AC potential on the pipeline section 321 and may utilize a computer system (e.g., machine 600 of FIG. 6) comprising one or more processors and related hardware to allow the selection of various capacitances of capacitors in the circuit and allow the selection of various windings of a transformer in order to achieve a desired level of AC current mitigation on the pipeline section 321.

It should be understood that the above configuration of the AC mitigation circuit 320 could be varied in order to adjust the level of mitigation of the AC potential buildup on the pipeline. For example in some scenarios the AC mitigation circuit 320 may not necessarily comprise the capacitor 311, instead, the pipeline section 321 may be directly connected to the transformer 314 and the ground wire 313 in series.

Figure 3C:
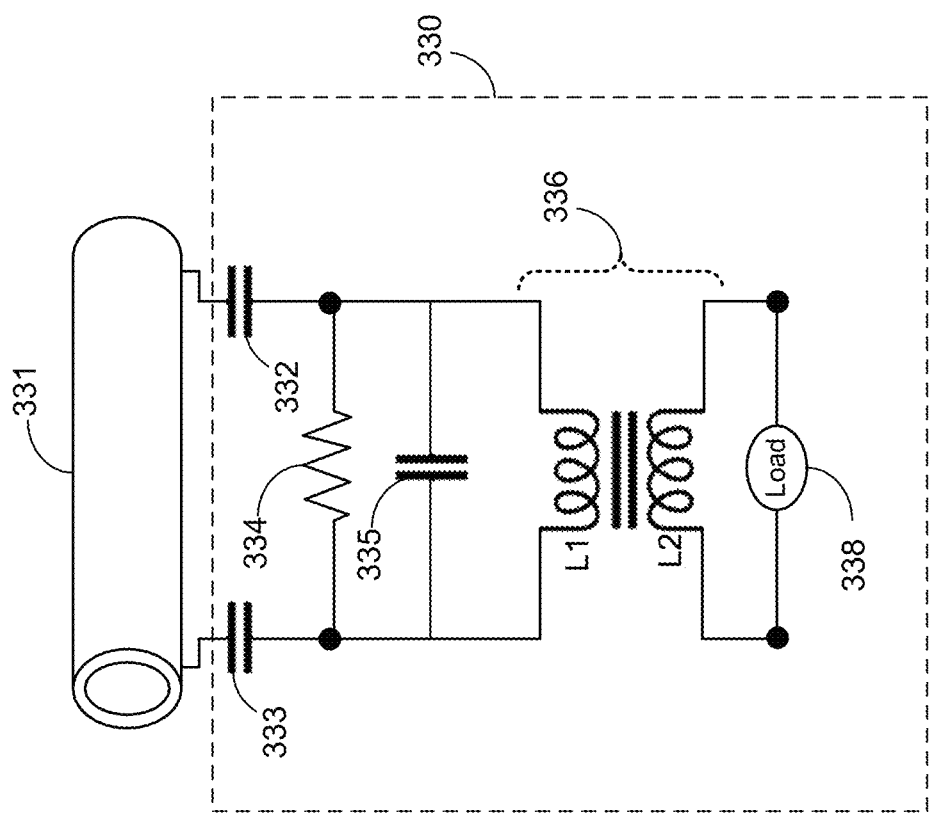

FIG. 3C depicts an illustrative schematic diagram for an AC mitigation circuit 330, in accordance with one or more example embodiments of the present disclosure.

Referring to FIG. 3C, the AC mitigation circuit 330 may be connected to a section 331 of a pipeline (e.g., pipeline 103 of FIG. 1) in order to mitigate AC potential buildup on the section 331.

In one or more embodiments, the AC mitigation circuit 330 may be comprised of a first capacitor 332, a second capacitor 333, a ground wire 334 (acting as a resistor), a capacitor 335, and a transformer 336. The capacitor 335 may be connected in parallel to the ground wire 334 and in parallel to the transformer 336. The first capacitor 311 and the second capacitor 312 may be optional and may be used in order not to impede any existing cathodic protection system on the pipeline 321. The AC mitigation circuit 330 may be considered a parallel RLC circuit.

In one or more embodiments, the AC mitigation circuit 330 may facilitate a decrease in the amount of energy in the circuit. This may be achieved by balancing and selecting specific capacitor 335 and a specific inductor L1 of the transformer 336 in order to achieve a resonant condition. Then L2 may be selected in comparison to L1 in order to decide on a type of transformer, e.g., a step-up or a step-down transformer. The L2 may be connected to a load 338 in order to remove energy from the circuit resulting in mitigation of the AC current buildup on the pipeline. In order to get into a resonant condition, the number windings on inductor L1 of the transformer 336 may have to correlate to the capacitance in the capacitor 335. In other words, the capacitor 335 may be chosen that has a specific capacitance, such that a transformer 336 may be chosen to have a number of windings that match the capacitance of the capacitor 335.

In one or more embodiments, the AC mitigation circuit 330 may be tuned at install in order to achieve a desired level of AC current mitigation on the pipeline section 331. In other embodiments, the AC mitigation circuit 330 may be varied one time after the install in order to achieve a desired level of AC current mitigation on the pipeline section 331.

In one or more embodiments, the AC mitigation circuit 330 may facilitate using a continuous measurement of the AC potential on the pipeline section 331 and may utilize a computer system (e.g., machine 600 of FIG. 6) comprising one or more processors and related hardware to allow the selection of various capacitances of capacitors in the circuit and allow the selection of various windings of a transformer in order to achieve a desired level of AC current mitigation on the pipeline section 331.

It should be understood that the above configuration of the AC mitigation circuit 330 could be varied in order to adjust the level of mitigation of the AC current buildup on the pipeline. For example, in some scenarios the AC mitigation circuit 330 may not necessarily comprise a capacitor 335, instead, the pipeline section 331 may be connected in parallel to the transformer 336 and in parallel to the ground wire 334.

Figure 4:
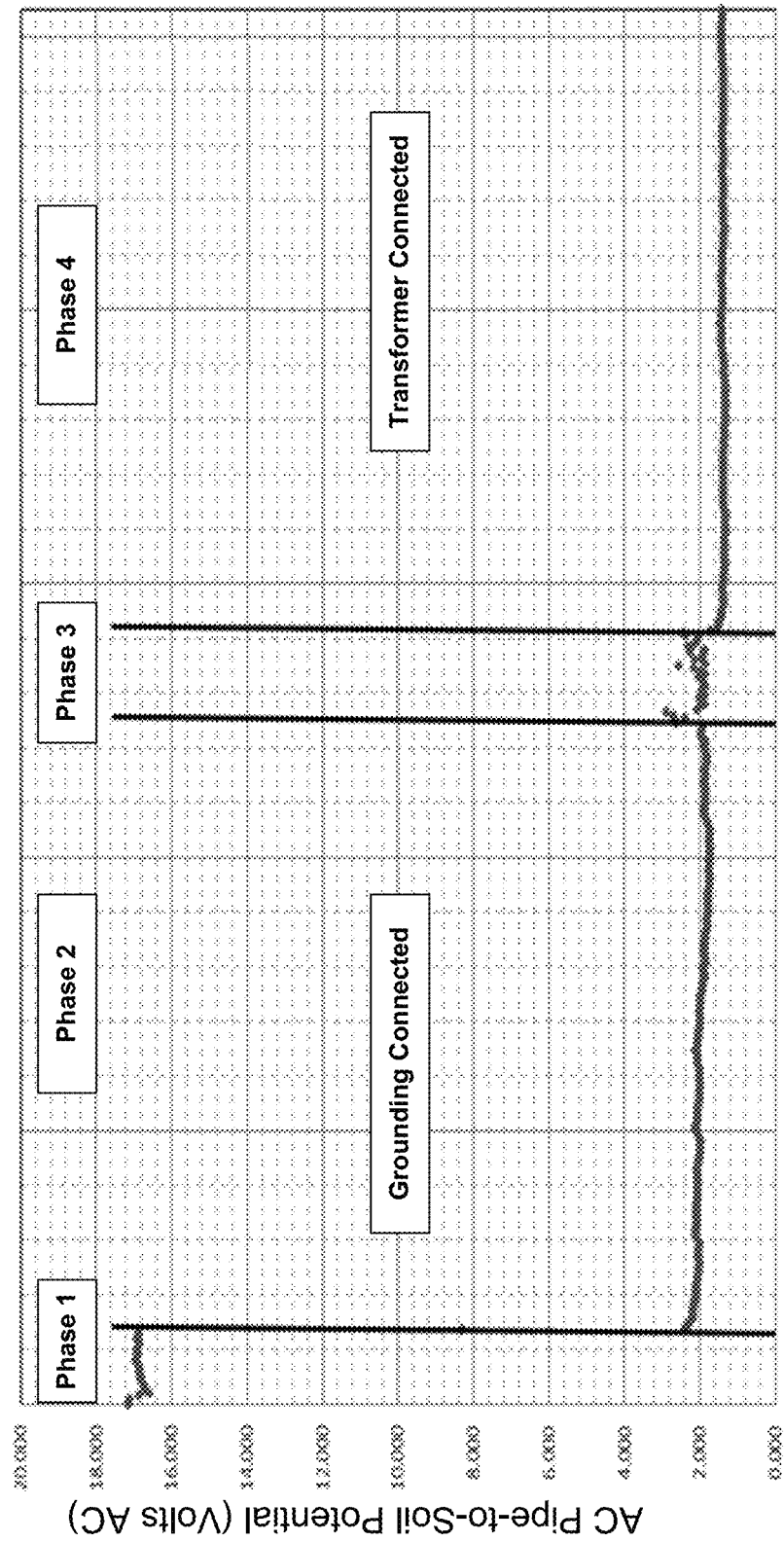
FIG. 4 illustrates a schematic diagram for AC voltage measurements, in accordance with one or more example embodiments of the present disclosure.

FIG. 4 depicts an illustrative schematic diagram 400 for AC voltage measurements, by in accordance with one or more example embodiments of the present disclosure.

Referring to FIG. 4, the schematic diagram 400 shows an example chart of AC pipe-to-soil potential in volts AC (y-axis) versus time in seconds (x-axis) using mitigation techniques in accordance with one or more example embodiments of the present disclosure.

In this example, AC current was induced on a 1 foot (30.48 cm) long section of pipeline (e.g., section 1040 pipeline 103 of FIG. 1) having an outside diameter (OD) of 12.750 inches (32.385 cm), with zinc ribbon (e.g., ground wire 105 of FIG. 1) connected in parallel to the pipe.

The current was induced via three (3) 500-foot wire spools of 12-gauge wire placed within the pipe and with slightly less than 10 amperes of current conducted through them.

The initial test was to determine if a transformer alone could bleed off enough energy to reduce the induced voltage on the 12.75 inch OD pipe. In this experiment, no capacitor was placed in the circuit. A stationary data logger, operating as a voltmeter, was connected to the 1-foot section of pipe, and a copper-copper sulfate reference electrode (CSE) with the tip placed in the ground. The positive terminal of the voltmeter was connected to the pipe, and the negative terminal was connected to the CSE. The experiment was divided into four (4) phases:

Phase 1: Initial conditions, no mitigation on the pipe;

Phase 2: Buried zinc ribbon connected in parallel to the pipe;

Phase 3: Transformer connected in parallel to the buried zinc ribbon (intermediate phase) showing noise from connecting the transformer to the circuit; and Phase 4: Transformer connected in parallel to the buried zinc ribbon.

This experiment, the primary circuit of the transformer was connected in parallel to the buried zinc ribbon (e.g., ground wire 105 of FIG. 1), while the secondary circuit of the transformer was "shorted."

AC voltage measurements were recorded at one (1) second intervals. The stationary data logger remained connected to the pipe for the full duration of the experiment.

Phase 1 represents the observed initial conditions on the 1-foot section pipe, prior to any AC mitigation connected to the pipe. The measured AC voltage prior to any mitigation connected to the pipe was 16.8 VAC.

Phase 2 began with the buried zinc ribbon connected at each end of the 1-foot section of pipe creating a parallel circuit. The AC potential on the pipe started to reach a steady state approximately 200 seconds after the buried zinc ribbon was connected. The measured AC potential with the buried zinc ribbon connected in parallel was 1.79 VAC.

Phase 3 began with connecting the primary circuit of the transformer in parallel with the buried zinc ribbon. This was an intermediate phase.

Phase 4 began with the transient decay of the voltage once the transformer was connected in parallel to the zinc ribbon. The transformer drove the AC pipe potential to a new steady state. The transformer was rated as a 1:120-volt step-up from its primary circuit to its secondary circuit. The resistance of the secondary circuit was low to increase the amount of energy dissipated from the primary circuit, in the form of heat. The AC potential on the pipe started to reach a steady state approximately 140 seconds after the transformer was connected. The measured AC potential with the transformer connected in parallel with the buried zinc ribbon connected in parallel was 1.39 VAC.

The measured AC voltage on the 1-foot section of pipe was reduced when the ground ribbon was connected to the pipe, as expected. The measured AC voltage on the 1-foot section of pipe was reduced further when the primary circuit of the transformer was connected in parallel with the ground ribbon. The measured AC potential dropped from 1.79 VAC to 1.39 VAC, or approximately 22%.

The transformer was rated as a 1:120-volt step-up from its primary circuit to its secondary circuit, with the resistance of the secondary circuit minimized. Having the ground ribbon connected to the primary circuit of the transformer had the greatest effect on reducing the measured AC voltage on the 1-foot section of pipe; the higher the step-up from the primary circuit to the secondary circuit, the lower the measured AC voltage on the 1-foot section of pipe. The lower the resistance on the transformer's secondary circuit, the lower the measured AC voltage on the 1-foot section of pipe.

Tuning a RLC circuit to its resonant condition the power angle is zero, removing unnecessary impedance due to capacitance only, can improve the tested AC mitigation design. Additionally, a transformer can be designed to transfer energy to the secondary effectively draining energy which further reduces the induced voltage on the AC mitigated pipeline and thus, the total energy returning to ground.

In phase 4 of the experiment, when the transformer is fully connected, the pipe AC voltage decays to a new steady state value. The lower the AC voltage, the more effective the AC mitigation system. The lowest measured AC voltage measurement occurred when:

The ground ribbon was connected in parallel with the primary circuit of the transformer;

The transformer was set to its highest ratio from the primary circuit to the secondary circuit; and The resistance of the secondary circuit was minimized.

The transformer was successful at removing energy induced on the pipe. Conversely, present AC mitigation strategies only transmit the induced AC current to ground.

While passive grounding designs have been shown to provide adequate mitigation for a majority of AC interference cases, scenarios exist where grounding alone cannot adequately reduce AC potential or current density to acceptable levels. In these cases, additional active mitigation techniques should be considered and analyzed. In theory, there is clear benefit to a resonant condition and removal of energy through heat. Both cases will lower the induced AC voltage on a pipeline.

It should be understood that the above experiment and the results are only meant for illustrative purposes and that other configurations for the AC mitigation circuit (e.g., AC mitigation circuit 108 of FIG. 1) described in various embodiments of the disclosure may be used and may have variation in the measured results.

Figure 5:
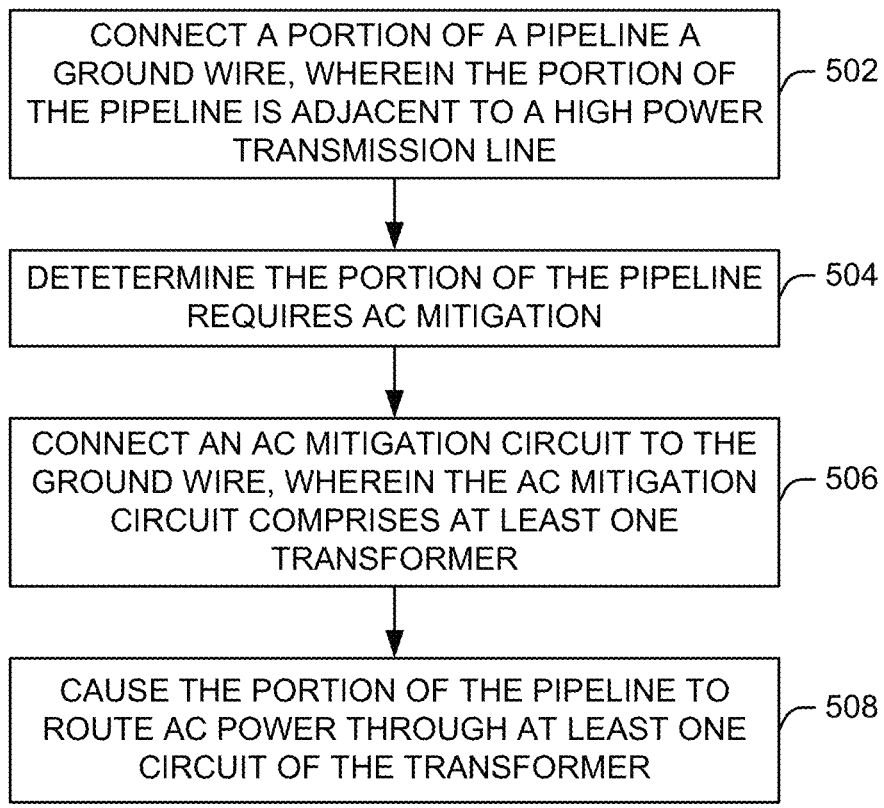
FIG. 5 illustrates a flow diagram of a process for an AC mitigation system, in accordance with one or more example embodiments of the present disclosure.

FIG. 5 illustrates a flow diagram of illustrative process 500 for an illustrative AC mitigation system, in accordance with one or more example embodiments of the present disclosure.

At block 502, the AC mitigation system may facilitate connecting a portion of the pipeline a ground wire, wherein the portion of the pipeline is adjacent to a HVAC transmission line.

At block 504, the AC mitigation system may facilitate determining the portion of the pipeline requires AC mitigation.

At block 506, the AC mitigation system may facilitate connecting an AC mitigation circuit to the ground wire, wherein the AC mitigation circuit comprises of at least one transformer.

At block 508, the AC mitigation system may facilitate causing the portion of the pipeline to route AC power through at least one circuit of the transformer.

It is understood that the above descriptions are for purposes of illustration and are not meant to be limiting.

Figure 6:
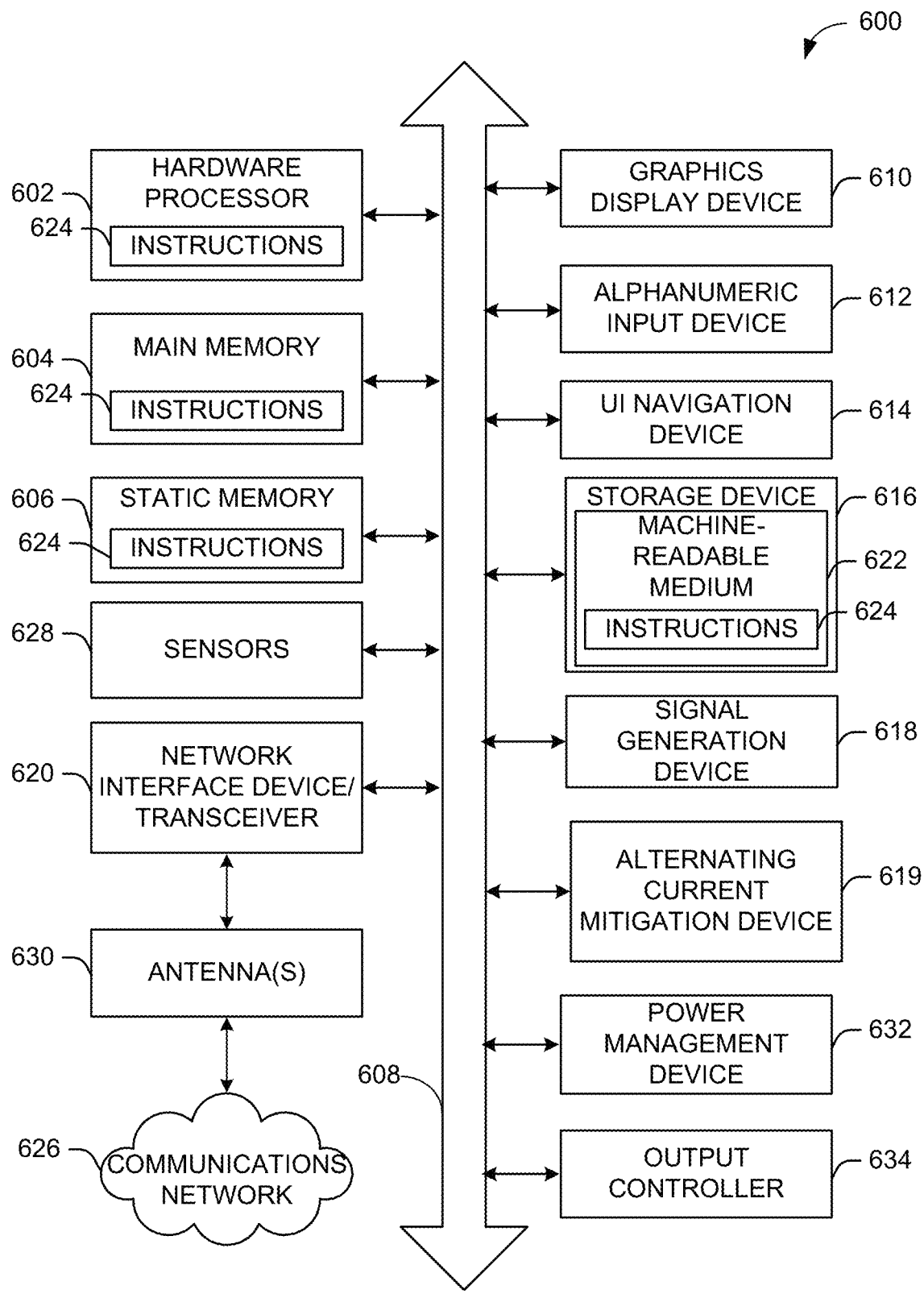
FIG. 6 depicts a block diagram of an example machine upon which any of one or more techniques (e.g., methods) may be performed, in accordance with one or more example embodiments of the present disclosure.

FIG. 6 illustrates a block diagram of an example of a machine 600 or system upon which any one or more of the techniques (e.g., methodologies) discussed herein may be performed. In other embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environments. The machine 600 may be a personal computer (PC), a tablet PC, a personal digital assistant (PDA), a mobile telephone, a wearable computer device, a web device, a network router, a switch or bridge, or any machine capable of executing instructions (sequential or otherwise) that specify actions to be taken by that machine, such as a base station. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the executions units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 600 may include a hardware processor 602 (e.g., a central processing unit (CPU), a graphics processing unit (GPU), a hardware processor core, or any combination thereof), a main memory 604 and a static memory 606, some or all of which may communicate with each other via an interlink (e.g., bus) 608. The machine 600 may further include a power management device 632, a graphics display device 610, an alphanumeric input device 612 (e.g., a keyboard), and a user interface (UI) navigation device 614 (e.g., a mouse). In an example, the graphics display device 610, alphanumeric input device 612, and UI navigation device 614 may be a touch screen display. The machine 600 may additionally include a storage device (i.e., drive unit) 616, a signal generation device 618 (e.g., a speaker), an AC mitigation device 619, a network interface device/transceiver 620 coupled to antenna(s) 630, and one or more sensors 628, such as a global positioning system (GPS) sensor, a compass, an accelerometer, or other sensor. The machine 600 may include an output controller 634, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)). The operations in accordance with one or more example embodiments of the present disclosure may be carried out by a baseband processor. The baseband processor may be configured to generate corresponding baseband signals. The baseband processor may further include physical layer (PHY) and medium access control layer (MAC) circuitry, and may further interface with the hardware processor 602 for generation and processing of the baseband signals and for controlling operations of the main memory 604, the storage device 616, and/or the AC mitigation device 619. The baseband processor may be provided on a single radio card, a single chip, or an integrated circuit (IC).

The storage device 616 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 616 may constitute machine-readable media.

The AC mitigation device 619 may carry out or perform any of the operations and processes (e.g., process 500) described and shown above.

The AC mitigation device 619 may facilitate a parallel connection of an active circuit to the pipeline. The circuit may comprise one or more transformers such that one side of a transformer circuit (e.g., primary circuit) may be connected to a grounding line that is electrically connected to the pipeline. The other side of the transformer circuit (e.g., secondary circuit) may be connected to a load in order to remove energy flowing into the transformer. The transformer may be a step-up or a step-down transformer having a ratio. The number of windings and the ratio of the transformer may be selected based on measurements performed at a section of the pipeline.

In one or more embodiments, an AC mitigation system may facilitate the addition of one or more capacitors to the AC mitigation circuit. The addition of the one or more capacitors may result in lowering the impedance of the circuit. Having a lower impedance increases the AC current flow in the circuit. It should be understood that capacitors may be already included in AC mitigation systems in order to minimize the interaction of the AC mitigation circuit with the already present cathodic protection system on the pipeline used to control external metal loss due to DC corrosion. In one or more embodiments, an AC mitigation system may minimize impedance and may draw energy out of the system either through heat or other ways in order to remove energy without bringing it back to the source (e.g., the pipeline).

The AC mitigation device 619 may facilitate the introduction of one or more transformers to the grounding path to create a resonant condition, referred to as a RLC circuit consisting of a resistor (R), inductor (L), and capacitor (C), from the known frequency of the induced AC resulting in the removal of energy from the circuit in the form of a magnetic field or electric field. When an RLC circuit is tuned to its resonant condition the power angle is zero, thus removing unnecessary impedance due to capacitance only, which is the case for current AC mitigation designs. The transformer may in turn facilitate the transfer energy to its secondary circuit effectively helping drain energy which reduces the induced voltage on the AC mitigated pipeline and the total energy returning to ground.

The AC mitigation device 619 may be tuned at install in order to achieve a desired level of AC current mitigation on a pipeline. In other embodiments, the AC mitigation system may be varied one time after the install in order to achieve a desired level of AC current mitigation on the pipeline.

The AC mitigation device 619 may facilitate using a continuous measurement of the AC potential on a pipeline and may utilize a computer system comprising one or more processors and related hardware to allow the selection of various capacitances of capacitors in the circuit and allow the selection of various windings of a transformer in order to achieve a desired level of AC current mitigation on a pipeline.

It is understood that the above are only a subset of what the AC mitigation device 619 may be configured to perform and that other functions included throughout this disclosure may also be performed by the AC mitigation device 619.

While the machine-readable medium 622 is illustrated as a single medium, the term "machine-readable medium" may include a single medium or multiple media (e.g., a centralized or distributed database, and/or associated caches and servers) configured to store the one or more instructions 624.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 600 and that cause the machine 600 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 624 may further be transmitted or received over a communications network 626 using a transmission medium via the network interface device/transceiver 620 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 620 may include one or more physical jacks (e.g., Ethernet, coaxial, or phone jacks) or one or more antennas to connect to the communications network 626. In an example, the network interface device/transceiver 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments.

The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A system for mitigating alternating current (AC) on one or more portions of a pipeline, the system comprising:
    a conductive portion of the pipeline, wherein the conductive portion of the pipeline is adjacent to a high voltage AC power transmission line;
    a ground wire connected to the conductive portion of the pipeline;
    a circuit electrically connected to the ground wire, wherein the circuit comprises one or more transformers, and wherein a primary circuit of at least one transformer of the one or more transformers is connected in series or in parallel to the ground wire, and a secondary circuit of the at least one transformer is connected to a load; and
    a means for the conductive portion of the pipeline to route AC power through the circuit.

2. The system of claim 1, wherein the means for the conductive portion of the pipeline to route AC power through the circuit comprises routing the AC current built up on the conductive portion of the pipeline through the circuit.

3. The system of claim 1, wherein the conductive portion of the pipeline comprises a dielectric layer connected to ground.

4. The system of claim 1, wherein the primary circuit is connected in series to at least one capacitor.

5. The system of claim 1, wherein the primary circuit is connected in parallel to at least one capacitor.

6. The system of claim 5, wherein the primary circuit of the at least one transformer and the at least one capacitor are balanced to induce a resonant condition of the circuit.

7. A method for mitigating alternating current (AC) on one or more portions of pipelines comprising:
    connecting a portion of the pipeline to a ground wire, wherein the portion of the pipeline is adjacent to a high voltage AC power transmission line;
    determining the portion of the pipeline requires AC mitigation;
    connecting an AC mitigation circuit to the ground wire, wherein the AC mitigation circuit comprises at least one transformer; and
    causing the portion of the pipeline to route AC power through at least one circuit of the transformer.

8. The method of claim 7, wherein causing to route the AC power comprises routing AC current built up on the portion of the pipeline through the transformer.

9. The method of claim 7, wherein the portion of the pipeline comprises a dielectric layer connected to ground.

10. The method of claim 7, wherein the transformer comprises a primary circuit and a secondary circuit, wherein the primary circuit is connected in parallel to the ground wire and a secondary circuit is connected to a load.

11. The method of claim 10, wherein the primary circuit is connected in parallel to at least one capacitor.

12. The method of claim 11, wherein the primary circuit of the transformer and the at least one capacitor are balanced to induce a resonant condition of the AC mitigation circuit.

13. The method of claim 7, wherein the transformer comprises a primary circuit and a secondary circuit, wherein the primary circuit is connected in series to the ground wire and wherein the secondary circuit is connected to a load.

14. The method of claim 8, wherein the primary circuit is connected in series to at least one capacitor.

15. An apparatus for mitigating alternating current (AC) on one or more portions of a pipeline, the apparatus comprising:
    a conductive portion of the pipeline, wherein the conductive portion of the pipeline is adjacent to a high voltage AC power transmission line, wherein the conductive portion of the pipeline includes a coating material;
    a ground wire connected to the conductive portion of the pipeline, wherein the ground wire is a bare ground wire connected to ground;
    an AC mitigation circuit to the ground wire, wherein the AC mitigation circuit comprises a transformer; and
    a means for the conductive portion of the pipeline to route AC power through the transformer.

16. The apparatus of claim 15, wherein the means for the conductive portion of the pipeline to route AC power through the transformer comprises routing the AC current built up on the conductive portion of the pipeline through a secondary circuit of the transformer.

17. The apparatus of claim 15, wherein the transformer comprises a primary circuit that is connected in series or in parallel to the ground wire.

18. The apparatus of claim 17, wherein the primary circuit is connected in series or in parallel to at least one capacitor.

* * * * *